United States Patent [19]
Yamauchi et al.

[11] Patent Number: 5,027,430
[45] Date of Patent: Jun. 25, 1991

[54] OUTDOOR UNIT LOW NOISE CONVERTER FOR SATELLITE BROADCAST RECEPTION USE

[75] Inventors: Miyoshi Yamauchi; Mitsuhiro Noboru, both of Osaka, Japan

[73] Assignee: Sharp Kabushiki Kaisha, Osaka, Japan

[21] Appl. No.: 503,095

[22] Filed: Mar. 30, 1990

Related U.S. Application Data

[63] Continuation of Ser. No. 200,555, May 31, 1988, abandoned.

[30] Foreign Application Priority Data

Jul. 24, 1987 [JP] Japan .................. 62-185877
Jul. 27, 1987 [JP] Japan .................. 62-115478

[51] Int. Cl.$^5$ .................................... H04B 1/10
[52] U.S. Cl. .................................... 455/188; 455/190; 455/296
[58] Field of Search ................ 455/188–190, 455/303, 306, 315, 133, 146, 143, 209, 180, 131, 296

[56] References Cited

U.S. PATENT DOCUMENTS

| | | | |
|---|---|---|---|
| 4,322,856 | 3/1982 | Ohta et al. | 455/189 |
| 4,509,198 | 4/1985 | Nagatomi | 455/4 |
| 4,592,093 | 5/1986 | Ouchi et al. | 455/190 |
| 4,596,045 | 6/1986 | Maier | 455/133 |
| 4,633,188 | 12/1986 | Matsuta | 455/188 |
| 4,726,072 | 2/1988 | Yamashita et al. | 455/197 |

OTHER PUBLICATIONS

European Patent Application No. 149,533 to Ouchi et al dated 10/1/85 Publication entitled "European Satellite Broadcasting, the Case for an FM Television Receiver" to Chaplin et al, Jun. 1983, pp. 252–255.

Primary Examiner—Curtis Kuntz

[57] ABSTRACT

An outdoor unit low noise converter for satellite broadcast reception use and 2-band low noise converter (LNB: Low Noise Block Downconverter), the so-called 2-band LNB for receiving two frequency bands. The low noise converter is capable of receiving a plurality of bands in one converter. The 2-band LNB has terminals as many as those of the LNB of one band by placing of power supply voltages upon the IF output.

26 Claims, 5 Drawing Sheets

OUTDOOR UNIT LOW NOISE CONVERTER FOR SATELLITE BROADCAST RECEPTION USE

This application is a continuation of application Ser. No. 07/200,555 filed on May 31, 1988, now abandoned.

BACKGROUND OF THE INVENTION

The present invention generally relates to a low noise converter of an outdoor unit for satellite broadcast reception use.

Generally, satellite broadcasting transmits electromagnetic waves in the range of 10.95 GHz through 12.75 GHz from a stationary satellite over the equator to the ground to effect a broadcasting operation to wider areas. A parabola antenna of high gain or a plane antenna thereof receives the waves and converts them into the signals of 1 GHz band near the antenna. This is because the received signals are required to be transmitted by a cable to an indoor receiver, such that the lower frequency allows the signal to be sufficient in strength. It is a low noise converter (LNB: Low Noise Block Downconverter) that affects the frequency converting operation.

The band width of the waves transmitted from the stationary satellite is normally 500 MHz through 800 MHz, in which the program of the satellite broadcasting of 1 through 24 channels are included. The low noise converter converts all the signals of this band width into the 1 GHz. For example, in the Europe Ku band, 11.7 GHz through 12.5 GHz are inputted, are converted into the signals of 950 MHz through 1750 MHz (800 MHz in band width) as IF signals, and are outputted so that the station can be selected by an indoor receiver.

FIG. 7 shows a circuit construction example of the conventional low noise converter. The input signals are amplified through a coaxial waveguide converting portion 1 by a low noise amplifier 2 of GaAs FET 2 through 3 step construction. Then, the received signals are passed into a band passing type filter 3 for preventing image signals or local signals so as to be mixed with an office transmitting signals from an office transmitting oscillator 5 by a mixer 4. They are further amplified by an IF amplifier 6 and are outputted as IF signals.

When the input signals are in the range of 11.7 GHz through 12.5 GHz, the office transmitting signals are 10.75 GHz and are converted into the frequencies of 950 MHz through 1750 MHz as IF signals. FIG. 8 shows a characteristic example of frequency relationship and a band pass type filter 3 utilized in the conventional low noise converter.

In the present invention, the frequencies which the satellite uses for the broadcasting operation are not only 11.7 GHz through 12.5 GHz (for example, the above-described Europe Ku band), but also frequency bands which are different from 10.95 GHz through 11.7 GHz (for example ECS (European Communication Satellite) band) and 12.25 GHz through 12.75 GHz (for example, Authert). Low noise converters adjusted for the frequency band are respectively prepared, so that a low noise converter is required to cooperate with the satellite to be received. Furthermore, a plurality of antennas and low noise converters are required when a plurality of satellites exist, the frequencies thereof are different respectively, or frequency bands are changed by the operation replacement of the satellites.

When the art of the circuit construction (which is designed to receive the signals of Europe Ku bands 11.7 GHz through 12.5 GHz) is extended so that signals in the range of 10.95 GHz through 12.5 GHz including, for example, the ECS band, are tried to be received, the conversion band width of the IF signal becomes 1550 MHz (=12.5 GHz through 10.95 GHz. Therefore, it is difficult for the indoor receiver to cover the range, thus considerably deteriorating the accuracy of the IF signals.

Also, in 2-band low noise converter (LNB: Low Noise Block Downconverter), so-called 2-band LNB for receiving two frequency bands, a signal for selecting a receiving band is required to be given to the 2-band LNB in order to receive two bands. Conventionally, a band switching input terminal 13, in addition to the IF output terminal 12 of the 2-band LNB1 as shown in FIG. 9, is provided. It is to be noted that in FIG. 9, reference numeral 14 is an input waveguide.

However, the 2-band LNB requires a sufficient airtight property for outdoor use thereof. It is an obstacle to maintain the airtight property to provide a band switching input terminal 13, in addition to an IF output terminal 12. This results in complicated construction.

SUMMARY OF THE INVENTION

Accordingly, an essential object of the present invention is to provide an improved low noise converter which is capable of receiving a plurality of bands in one converter.

Another important object of the present invention is to provide a 2-band LNB which has as many terminals as those of the LNB of one band, by placing of power-supply voltages upon the IF output.

For the solution by the conventional problems, the present invention provides a low noise converter which has a low-noise amplifier of a wider bandwidth, a power divider for dividing the output signal of the amplifier to a plurality of signals, a plurality of band pass type filters and mixer circuits provided which corresponds respectively to the divided signals, and an output selecting circuit for switching the output signals of each mixer circuit to the after-IF amplifier. Accordingly, in a converter of the above-described construction, input signals, including a plurality of bands, are amplified by a wide band, low noise amplifier and are divided by the power divider. The signals are divided and, thereafter, pass through filters each having a given passing band, and are mixed with office transmitting signals which have been set for each band in the mixer circuit. The output switching to the IF amplifier is affected by an output selecting circuit so that a plurality of bands may be received by one converter, with the band width of the IF signal not being made wider.

Also, the present invention provides a 2-band LNB which has means for switching frequency bands to be received in accordance with the level of the power supply voltage to be fed through the IF signal terminal.

The converter of the above-described construction does not require the band switching input terminal to improve the airtight property, thus simplifying the construction.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
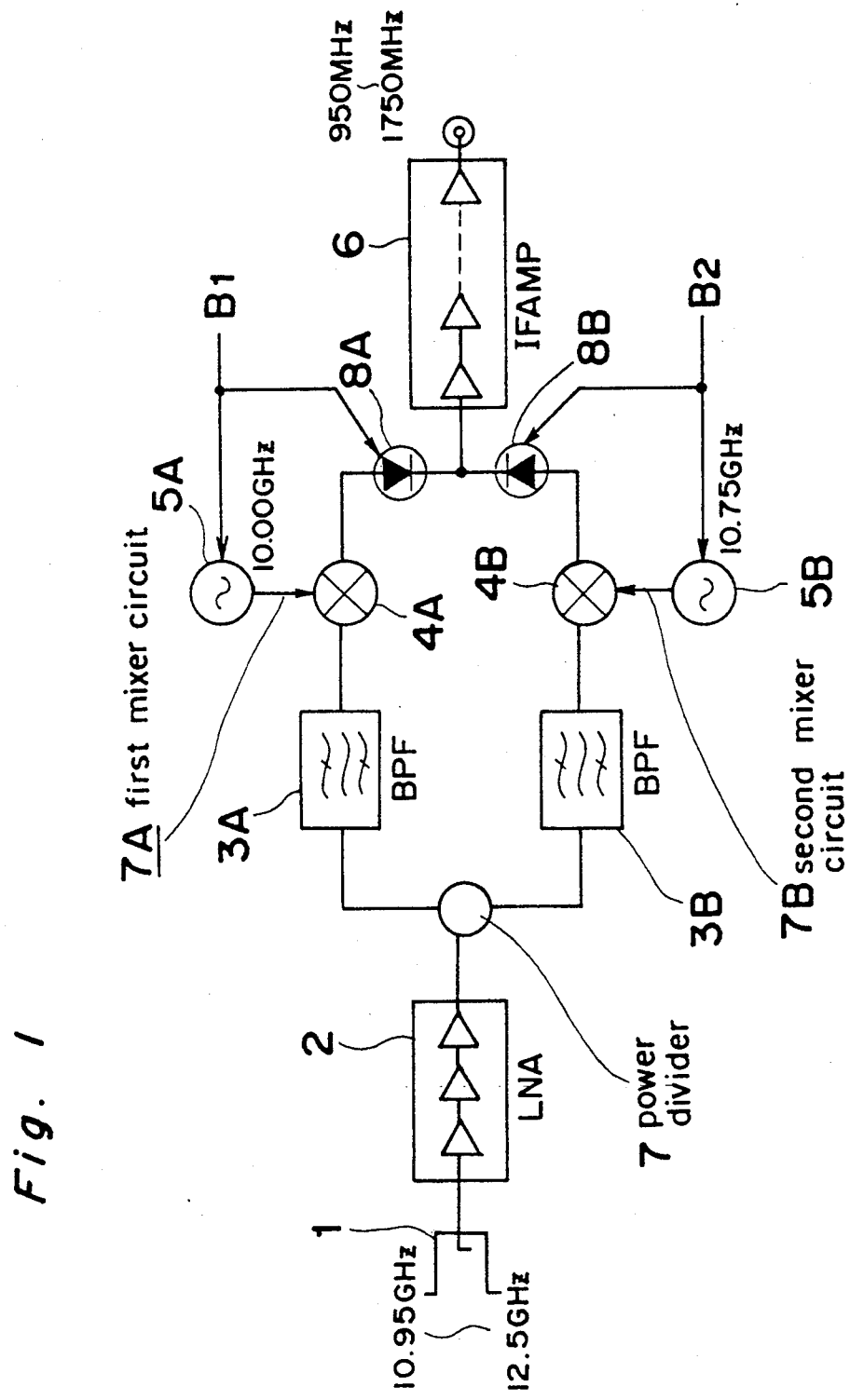
FIG. 1 is a circuit diagram in one embodiment of the present invention.

Before the description of the present invention proceeds, it is to be noted that like parts are designated by like reference numerals throughout the accompanying drawings.

(First Embodiment)

Figure 2:
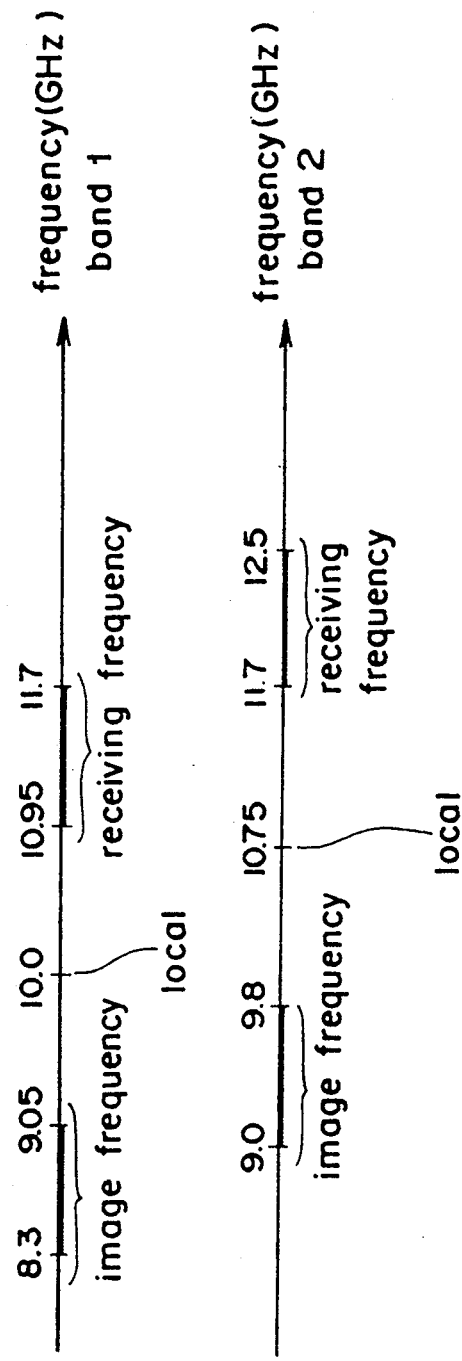
FIG. 2 is a graph showing the relationship of two bands for receiving operation.

The circuit construction in a first embodiment of the present invention is shown in FIG. 1. Also FIG. 2 shows the frequency relation of a plurality of bands to be received. Here, the ECS band of 10.95 GHz through 11.7 GHz and the Europe Ku band of 11.7 GHz through 12.5 GHz, two bands, are switched for reception.

Figure 6:
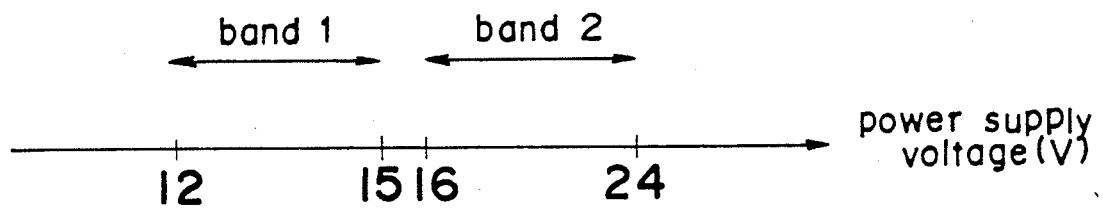
FIG. 6 is a waveform chart thereof.
Figure 9:
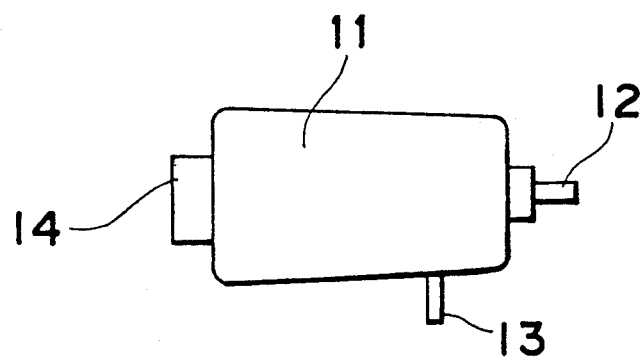
FIG. 9 is an appearance view showing the convention embodiment.
Figure 7:
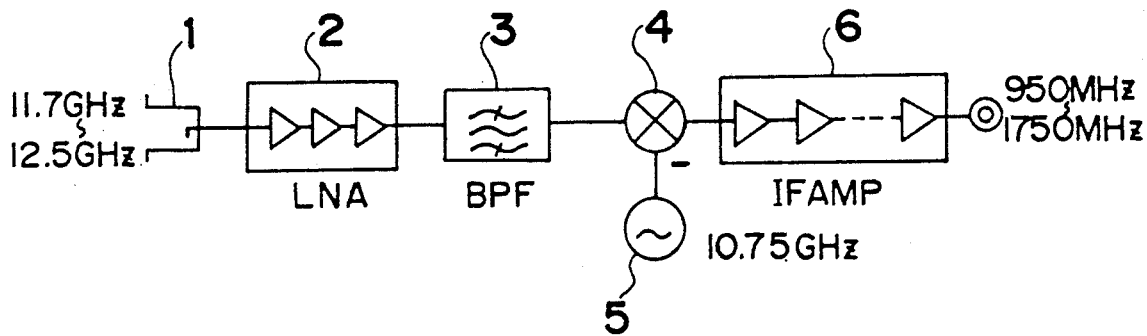
FIG. 7 is a circuit diagram showing the conventional example.
Figure 8:
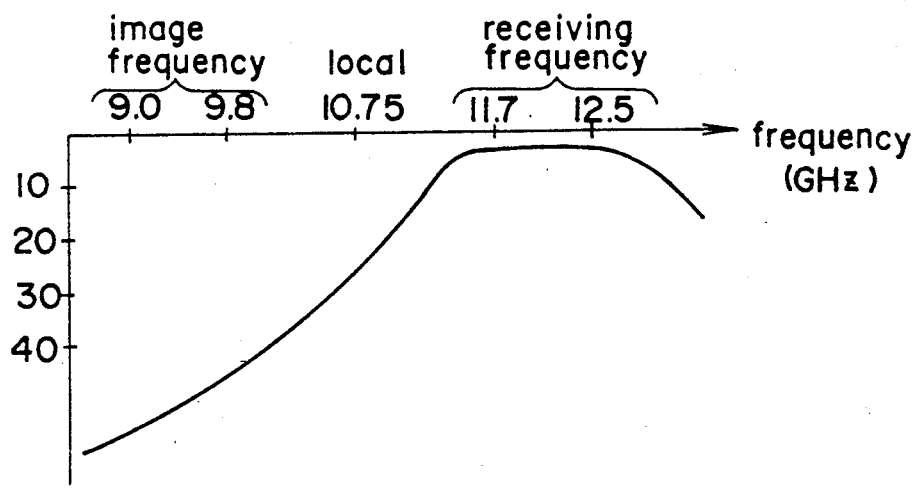
FIG. 8 is a chart showing the characteristics of the conventional reception frequency relationship and a band passing type filter.

In FIG. 1, the same reference characters are given to the function portions which are the same as those of FIG. 6. The low noise amplifier 2 is widened in band width so that the signals of 10.95 GHz through 12.5 GHz may be amplified. A power divider 7 divides the amplified output signal into two for connection to each of a first band passing type filter 3A with, for example, 10.95 GHz through 11.7 GHz being a passing band and, a second band passing type filter 3B with, for example, 11.7 through 12.5 GHz being a passing band. Also, in accordance with it, a first mixer circuit 7A composed of a mixer 4A and a voltage-controlled oscillator 5A with a transmitting signal of 10.00 GHz is connected with a second mixer circuit 7B composed of a mixer 4B and a voltage-controlled oscillator 5B with a transmitting signal 10.75 GHz.

The output switching operation into the after-IF amplifier 6 is selected by the control of the oscillating operation of the respective voltage controlled oscillators 5A, 5B with voltages B1, B2 as power supply, and diode switches 8A, 8B connected in series respectively to mixers 4A, 4B. It is to be noted that diode switches 8A, 8B are adapted to turn and, off through the operative cooperation with the controlling operation of the oscillation with the voltages B1, B2 in common.

In the first mixer circuit 7A, the signals of 10.95 GHz through 11.7 GHz which have passed through the first band passing type filter A are converted into the frequencies of 950 MHz through 1700 MHz (750 MHz in band width) because of the above description. In the second mixer circuit 7B, similarly the signals of 11.7 GHz through 12.5 GHz which have passed through the second band passing filter 3B are converted into the frequencies of 950 MHz through 1750 MHz (800 MHz in band width). In this manner, frequencies, if in any band, are selectively outputted into the IF amplifier 6 within the range of 950 MHz through 1750 MHz, with the band width not being made larger and being within the range of 750 MHz through 800 MHz, so that they are sufficiently covered by the outdoor receiver. Also, the mixing, for example, is naturally performed without deterioration of the IF signal characteristics.

In the above description, two bands are provided. It is to be easily understood that the same embodiment may be performed with two or more bands.

In the first embodiment of the present invention, a useful low noise converter for satellite broadcasting reception is provided, which is capable of receiving a plurality of bands by one converter for converting the signal to the proper operational frequency.

(Second Embodiment)

The second embodiment of the present invention will be fully described with reference to FIGS. 3 through 6.

Figure 5:
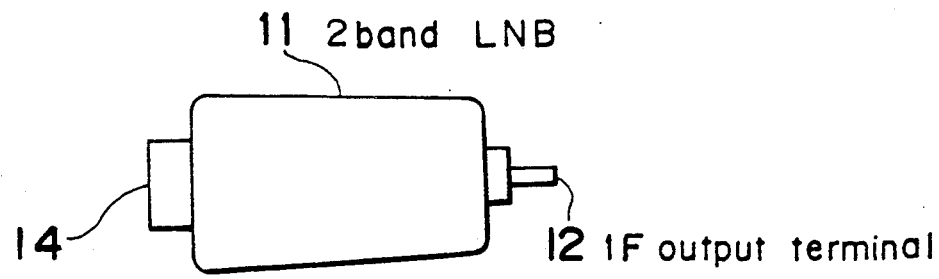
FIG. 5 is an appearance view thereof.

FIG. 5 shows an appearance view of a 2-band LNB1 in accordance with the present invention. Referring to FIG. 5, external terminals are an input waveguide 14 (generally the input terminal is made of a waveguide or may even be made of a coaxial cable) to be connected with an antenna and an IF output terminal 12 only. Accordingly, the airtight construction does not change because of the two bands. Also, the IF output terminal 12 serves as a power supply.

Figure 3:
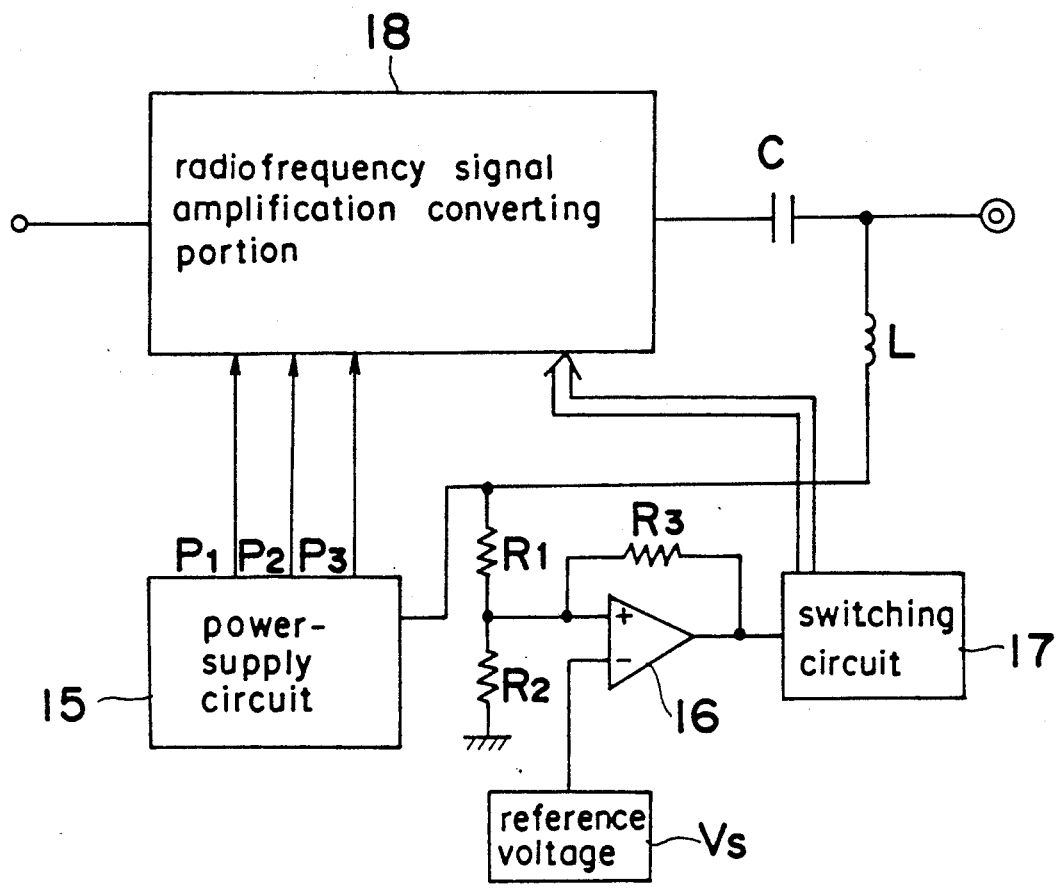
FIG. 3 is a circuit diagram in a second embodiment of the present invention.

The band switching will be described by use of the circuit diagram of FIG. 3. Referring to FIG. 3, the power supply voltage to be supplied through the IF output terminal 12 is drawn out by a coil L to be supplied to power supply circuit 15. It is divided by resistors R1, R2 to be connected with a reference voltage Vs by a comparator 16, so that the output is inputted to the switching circuit 17, for example, a relay. As shown in FIG. 6, in the switching circuit 17, a band 1 is selected if the voltage is 12 through 15, a band 2 is selected if the voltage is 16 through 24, with, for example, 15 through 16 in voltage being a threshold voltage (boundary). Also, the power supply circuit 15 is composed of a three-terminal regulator, and outputs to a radio frequency signal amplification converting portion 18 with the inputs being provided as 12 through 25V, the outputs P1 through P3 being provided as −3V, 5V, 12V. It is to be noted that C is a capacitor for DC cut use, R3 is a resistor which causes hysteresis characteristics so as to prevent the output of the comparator from being unstable near the threshold voltage.

Figure 4:
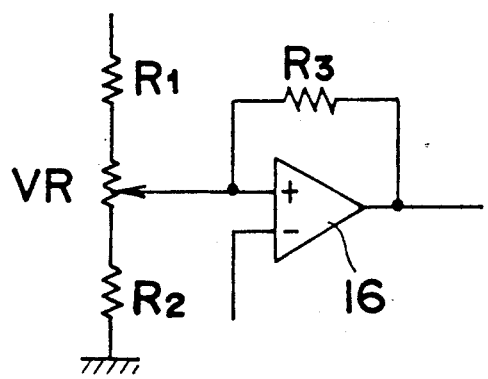
FIG. 4 is a circuit diagram showing an application example thereof.

Also, as shown in FIG. 4, a variable resistor VR is inserted for adjustment in order to prevent the dispersion of the threshold voltage caused by the dispersion of the reference voltage Vs.

According to the second embodiment of the present invention, a useful 2-band LNB is provided which is capable of receiving two frequency bands by one LNB to simplify the construction and to reduce the cost, and also is higher in airtightness to simplify the construction of the LNB itself.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A low noise frequency converter for satellite broadcasting reception use for converting and selecting one of a plurality of input signal bands, comprising:
   input means for receiving multiple input signals having different frequency bands consisting essentially of,
      a single low-noise amplifier means for amplifying all of the multiple input signals and outputting amplified signals, and
      power dividing means for dividing the output signals of the amplifier means into a plurality of divided amplified signals;
   a plurality of band-pass filter means, each operatively connected to said input means and corresponding to a different set of said amplified signals, for passing only signals within a specified frequency band to eliminate amplified noise outside of the specified frequency band;
   a plurality of mixing means, each operatively connected to a different one of said plurality of band-pass filter means, for converting said passed signals into IF signals, said plurality of mixing means converting signals of limited bandwidth to substantially eliminate noise; and
   output selecting means, operatively connected to said plurality of mixing means, for selecting signals converted by one of said plurality of mixing means.

2. A converter, as claimed in claim 1, wherein said multiple input signals consist essentially of signals in the gigahertz frequency range.

3. A converter, as claimed in claim 2, wherein said band-pass filters each pass signals within a specified frequency band in the gigahertz frequency range.

4. A converter, as claimed in claim 2, wherein the multiple input signals comprise signals in the European Communication Satellite (ECS) frequency band and the Europe Ku frequency band.

5. A converter, as claimed in claim 4, wherein said output selecting means selects signals converted from the ECS frequency band or the Europe Ku frequency band.

6. A converter, as claimed in claim 2, wherein said output selecting means selects signals converted from input signals in the gigahertz frequency range.

7. A converter, as claimed in claim 1, wherein each of said plurality of mixing means consists essentially of,
   a mixer, and
   an oscillator.

8. A converter, as claimed in claim 7, wherein each said oscillator of each of said mixing means is controlled by an input voltage.

9. A converter, as claimed in claim 8, wherein said output selecting means consists essentially of a plurality of diodes and wherein a converted signal from one of said plurality of mixing means is selected by when an input voltage is applied to an oscillator of one of said plurality of mixing means.

10. A low noise frequency converter for converting signals within a selected gigahertz frequency band into signals within an IF frequency band, comprising:
    input means for receiving multiple input signals having different frequency bands consisting essentially of,
       a single low-noise amplifier means for amplifying said multiple input signals, and
       power dividing means, operatively connected to said amplifier means, for dividing said amplified signals;
    a plurality of band-pass filter means, each operatively connected to said dividing means, for passing only amplified divided signals of a specified frequency band in the gigahertz frequency range to eliminate amplified noise outside of the specified frequency band;
    a plurality of mixing means, operatively connected to said plurality of band-pass filter means, for converting said passed signals into signals within a desired frequency range, said plurality of mixing means converting passed signals of limited bandwidth to substantially eliminate noise; and
    output selecting means, operatively connected to said plurality of mixing means, for selecting signals converted by one of said plurality of mixing means.

11. A converter, as claimed in claim 10, wherein the input signals comprise signals within the European Communication Satellite (ECS) frequency band and the European Ku frequency band.

12. A converter, as claimed in claim 11, wherein said plurality of band-pass filter means comprises means for passing signals of the ECS frequency land and comprises means for passing signals of the European Ku frequency band.

13. A converter, as claimed in claim 12, wherein said output selecting means selects signals converted from the ECS frequency band of the European Ku frequency band.

14. A converter, as claimed in claim 10, wherein said plurality of mixing means converter said passed signals into signals within an IF frequency range.

15. A converter, as claimed in claim 14, wherein said output signals from said output selecting means are directed to an IF amplifier.

16. A converter, as claimed in claim 10, wherein each of said plurality of mixing means consists essentially of,
    a mixer, and
    an oscillator.

17. A converter, as claimed in claim 16, wherein each of said oscillators of each of said mixing means is controlled by an input voltage.

18. A converter, as claimed in claim 17, wherein said output selecting means consists essentially of a plurality of diodes and wherein a converted signal from one of said plurality of mixing means is selected when an input voltage is applied to an oscillator of one of said plurality of mixing means.

19. A method of selecting signals within a desired gigahertz frequency band and converting them into signals with a desired IF frequency band, comprising the steps of:
    inputting signals, comprising signals in the gigahertz frequency range;
    amplifying said input signals;
    filtering said amplified input by signals a plurality of desired gigahertz frequency bandwidths by means of a plurality of band pass filtering means to eliminate amplified noise outside of the desired gigahertz frequency bandwidths;
    converting said band-pass filtered signals into signals of a desired IF frequency band by means of a plurality of converting means, the converting means converting passed signals of limited bandwidth to substantially eliminate noise; and
    selecting signals converted from one of said desired gigahertz frequency bands.

20. A method of claim 19, further comprising the steps of:

outputting said selected converted signals to an IF-frequency amplifier.

21. A method, as claimed in claim 19, wherein said plurality of desired gigahertz frequency bands to be band-pass filtered, comprises the European Communication Satellite (ECS) frequency band and the European Ku frequency band.

22. A method, as claimed in claim 21, wherein said selected signals are signals converted from a desired one of said ECS frequency band or said European Ku frequency band.

23. A method, as claimed in claim 19, wherein each of said plurality of converting means consists essentially of:
   a mixer; and
   an oscillator.

24. A method as claimed in claim 23, wherein each of aid oscillator, of each of said converting means, is controlled by an input voltage.

25. A method, as claimed in claim 24, wherein signals are selected by activating one of a plurality of diodes.

26. A method, as claimed in claim 25, wherein said selected signals are selected when an input voltage is applied to a particular converting means and a particular diode.

* * * * *